(12) United States Patent
Gigacher et al.

(10) Patent No.: US 8,888,952 B2
(45) Date of Patent: Nov. 18, 2014

(54) APPARATUS FOR WET TREATMENT OF PLATE-LIKE ARTICLES

(75) Inventors: Markus Gigacher, Klagenfurt (AT); Michael Brugger, Millstatt (AT)

(73) Assignee: Lam Research AG, Villach (AT)

( * ) Notice: Subject to any disclaimer, the term of this patent is extended or adjusted under 35 U.S.C. 154(b) by 198 days.

(21) Appl. No.: 12/675,845

(22) PCT Filed: Aug. 7, 2008

(86) PCT No.: PCT/EP2008/060375
§ 371 (c)(1),
(2), (4) Date: Mar. 1, 2010

(87) PCT Pub. No.: WO2009/027194
PCT Pub. Date: Mar. 5, 2009

(65) Prior Publication Data
US 2010/0206481 A1    Aug. 19, 2010

(30) Foreign Application Priority Data
Aug. 30, 2007    (AT) .................................. A 1360/2007

(51) Int. Cl.
*H01L 21/683*    (2006.01)
*C23F 1/08*    (2006.01)
*H01L 21/465*    (2006.01)
*H01L 21/67*    (2006.01)

(52) U.S. Cl.
CPC ...... *H01L 21/67051* (2013.01); *H01L 21/6838* (2013.01)
USPC .................. 156/345.55; 156/345.21; 118/730; 257/E21.485; 257/E21.001

(58) Field of Classification Search
CPC ........ H01L 21/683; H01L 21/465; C23F 1/08

USPC ........................ 156/345.55, 345.21; 118/730; 257/E21.485, E21.001
IPC ............................................ B08B 3/04
See application file for complete search history.

(56) References Cited

U.S. PATENT DOCUMENTS 5,927,305 A * 7/1999 Shiba ............................. 134/153
6,357,457 B1 * 3/2002 Taniyama et al. ........... 134/57 R (Continued)

FOREIGN PATENT DOCUMENTS

| JP | 2001319910 A | * 11/2001 |
| JP | 2004-134431 A | 4/2004 |
| JP | 2006-157008 A | 6/2006 |

OTHER PUBLICATIONS

Machine Generated English Translation of JP 2001-319910 published Nov. 16, 2001.*

(Continued)

*Primary Examiner* — Sylvia R MacArthur
(74) *Attorney, Agent, or Firm* — Young & Thompson

(57) ABSTRACT

Disclosed is an apparatus for wet treatment of a plate-like article, which includes: a spin chuck for holding and rotating the plate-like article including an element for holding the plate-like article at the plate-like article's edge and a gas supply element for directing gas towards the side of the plate-like article, which faces the spin chuck, wherein the gas supply element includes a gas nozzle rotating with the spin chuck, for providing a gas cushion between the plate-like article and the spin chuck; a fluid supply element for directing fluid onto the side of the plate-like article, which is facing the spin chuck, through a non-rotatable fluid nozzle.

17 Claims, 2 Drawing Sheets

(56) References Cited

U.S. PATENT DOCUMENTS

| | | | |
|---|---|---|---|
| 6,786,996 B2* | 9/2004 | Emami | 156/345.1 |
| 7,282,096 B2* | 10/2007 | Strauch | 118/728 |
| 2002/0050244 A1 | 5/2002 | Engesser | |
| 2002/0134512 A1 | 9/2002 | Adachi et al. | |
| 2004/0065354 A1 | 4/2004 | Ishizaki et al. | |
| 2010/0206481 A1* | 8/2010 | Gigacher et al. | 156/345.21 |

OTHER PUBLICATIONS

International Search Report dated Nov. 25, 2008, from corresponding PCT application.

Japanese Office Action, dated Jul. 24, 2012, from corresponding JP application.

* cited by examiner

APPARATUS FOR WET TREATMENT OF PLATE-LIKE ARTICLES

TECHNICAL FIELD

The invention relates to an apparatus for wet treating of a single plate-like article, comprising a spin chuck for holding and rotating the plate-like article, comprising means for holding the plate-like article at the plate-like article's edge and gas supply means for directing gas towards the side of the plate-like article, which is facing the spin chuck, wherein the gas supply means comprises a gas nozzle rotating with the spin chuck, for providing a gas cushion between the plate-like article and the spin chuck.

The term wet treating basically means wetting the plate-like article in order to clean or etch or dispose of a material.

If in the following the term wafer is used such plate-like articles are meant.

Such plate-like articles can be semiconductor wafers, or compact discs as well as polygonal articles such as flat panel displays or reticles.

BACKGROUND ART

U.S. Pat. No. 5,513,668 discloses an apparatus for wet treatment of a plate-like article comprising a spin chuck for holding and rotating comprising means for holding the plate-like article at the plate-like article's edge and a gas supply means for directing gas towards the side of the plate-like article, which is facing the spin chuck, wherein the gas supply means comprises a gas nozzle rotating with the spin chuck, for providing a gas cushion between the plate-like article and the spin chuck. Such a chuck is commonly known as Bernoulli-Chuck because the plate-like article is pulled towards the chuck by vacuum generated due to the aerodynamic paradox called Bernoulli-Effect. Such Bernoulli-chucks may comprise radially movable pins, wherein the pins securely hold the plate-like article even if no pressurized gas is providing the Bernoulli-Effect.

Alternatively Bernoulli-chucks may comprise non-movable pins on which the plate-like article rests (preferably on the plate-like article's edge region, where the mechanical contact does not harm the plate-like article). In this case the plate-like article is drawn towards the pins and securely held by Bernoulli-Effect.

For specific application it is advantageous to also apply liquid to the side of the plate-like article, which faces the chuck. Spin chucks with a gas supply towards the side of the plate-like article, which faces the chuck, (so called Bernoulli chucks) do not have a liquid supply nozzle for particle free rinsing of the side of the plate-like article, which faces the chuck. Furthermore, known spin chucks, which are designed for liquid treatment of both sides of a plate-like article, have no gas feed means for providing a gas cushion to have the plate-like article's side, which faces the spin chuck, protected from being wetted by treatment liquid.

DISCLOSURE OF INVENTION

The invention meets the objects by providing an apparatus for wet treatment of a single plate-like article comprising:
a spin chuck for holding and rotating the plate-like article comprising means for holding the plate-like article at the plate-like article's edge and gas supply means for directing gas towards the side of the plate-like article, which faces the spin chuck, wherein the gas supply means comprises a gas nozzle rotating with the spin chuck, for providing a gas cushion between the plate-like article and the spin chuck;
a fluid supply means for directing fluid onto the side of the plate-like article, which is facing the spin chuck, through a non-rotatable fluid nozzle.

The provided apparatus has the advantage that a liquid which might be dispensed onto the first side of the plate-like article, which does not face the chuck, cannot flow onto the second side of the plate-like article, which faces the chuck. This protection is carried out by a gas cushion between the spin chuck and the plate-like article. Simultaneously the provided apparatus allows for the treatment of the second side of the plate-like article with a fluid (preferably a liquid) through a pipe, which can be kept particle free, by the complete avoidance of rotating parts for the fluid supply line (such as a revolving joint or a rotary union).

The gas supply means may comprise a plurality of gas nozzles, which may be annularly arranged with respect to the rotational axis. However the gas nozzles may be randomly arranged.

Alternatively or additionally the gas supply means may comprise an annular gas nozzle, which allows an even and smooth gas cushion to support the plate-like article.

In a preferred embodiment the gas nozzle is fed through a rotating gas distribution chamber, which is part of the spin chuck. Advantageously the gas distribution chamber is annularly arranged around the spin chuck's axis and is inwardly open towards the central hole of the spin chuck.

In a preferred embodiment the gas distribution chamber is fed through a non-rotating gas feed. This gas feed can comprise one single gas nozzle, which radially supplies gas from the central non-rotating nozzle head into the rotating gas distribution chamber Preferably the non-rotatable gas feed comprises a gas distribution chamber (preferably annularly shaped) and a plurality of annularly arranged nozzles or a slit-shaped annular nozzle for feeding the rotating gas distribution chamber. This enables a highly uniform axisymmetric distribution of the gas flow.

In a preferred embodiment the non-rotatable fluid nozzle and the non-rotatable gas feed are elements of a nozzle assembly, which axially projects through the centre of the spin chuck.

Advantageously the spin chuck comprises a plate parallel to the plate-like article, the plate having a central hole, through which the non-rotatable fluid nozzle leads through. If the gap between the plate and the nozzle is selected as not more than 0.5 mm (preferably not more than 0.2 mm) almost no gas leaks through the gap but the gas flows through the rotating gas nozzle or gas nozzles.

Although the spin chuck could work with fixed holding elements (holding the plate-like article by friction force) the spin chuck preferably comprises movable gripping elements for gripping the plate-like article at its edge and releasing it when the plate-like article is taken off the spin chuck. This has the advantage that the gas for providing the gas cushion can be shut off or significantly reduced when the fluid supply (e.g. liquid supply) is turned on. Therefore it is possible that the gas for providing the gas cushion does not interfere with the treatment fluid (e.g. liquid).

In one embodiment the apparatus comprises at least two non-rotatable fluid nozzles, e.g. one for dispensing liquid towards the plate-like article's surface facing the spin chuck and one for dispensing gas (e.g. drying gas)

In another embodiment a non-rotatable fluid nozzle is connected to a liquid source.

BEST MODE FOR CARRYING OUT THE INVENTION

Figure 1:
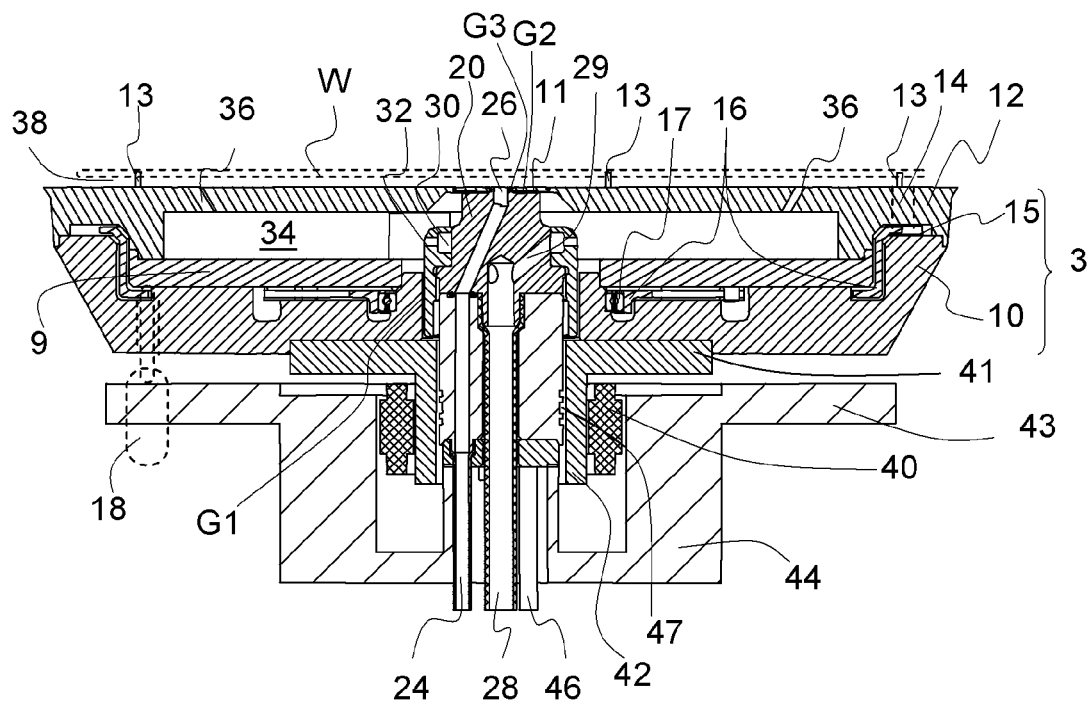
FIG. 1 shows details of a wet treatment apparatus according to the present invention in a cross-sectional perspective view.
Figure 2:
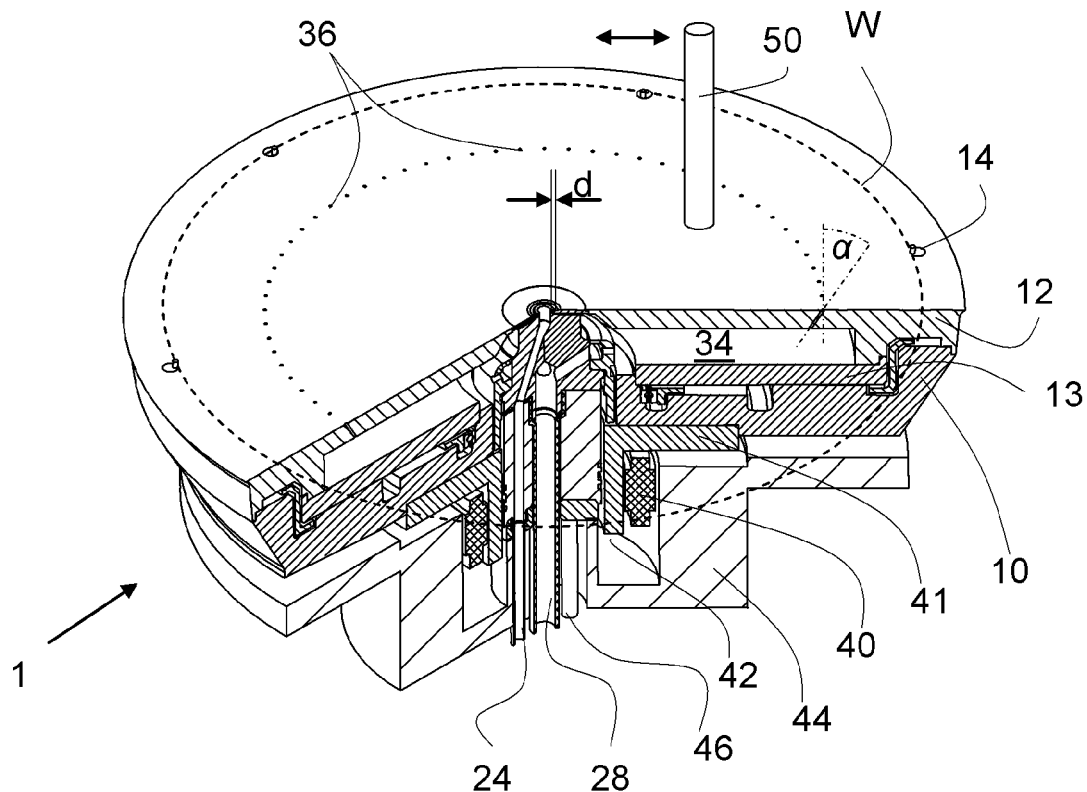
FIG. 2 shows details of a wet treatment apparatus according to the present invention in a cross-sectional view.
Figure 3:
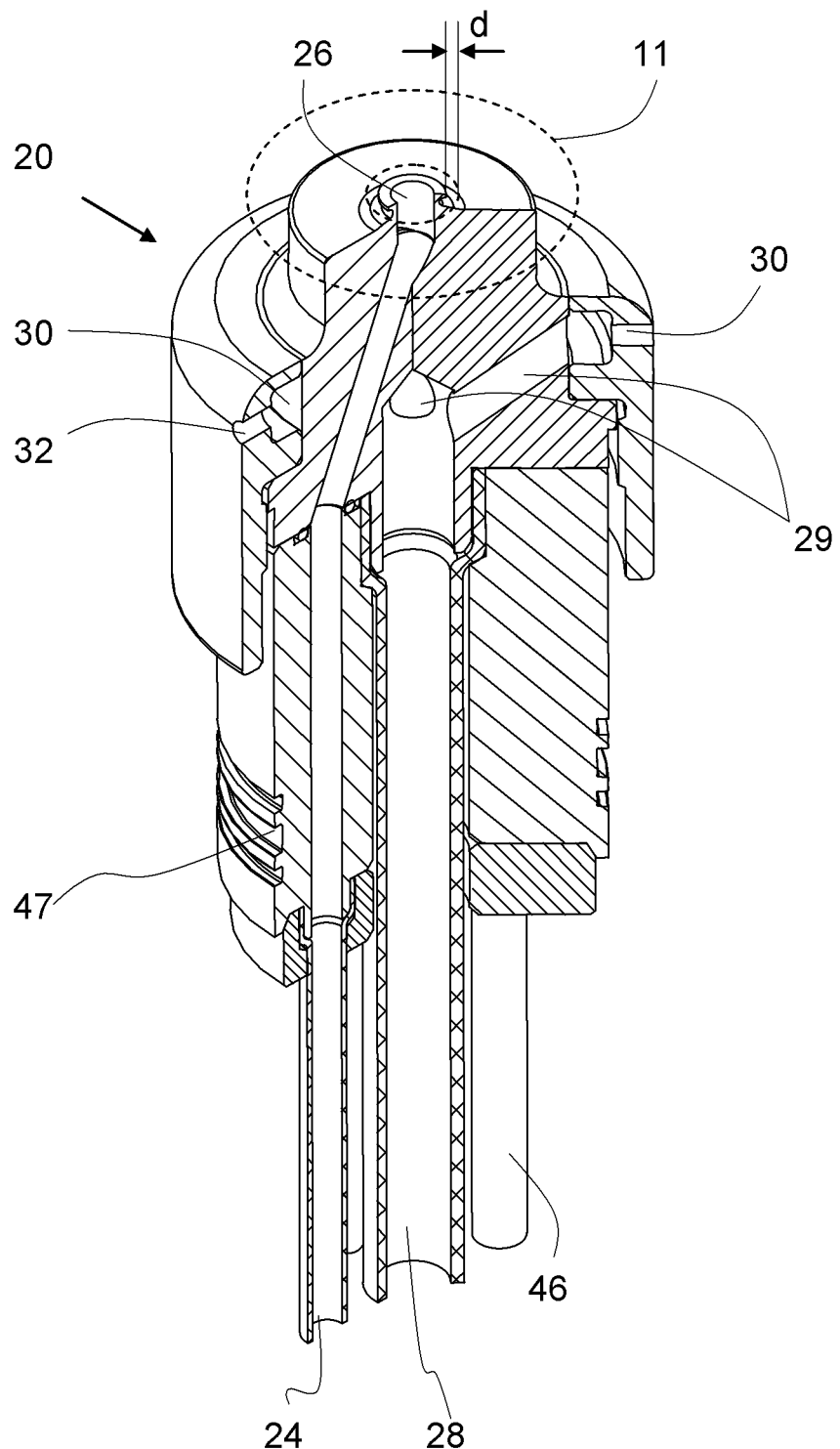
FIG. 3 shows a detailed view of the non-rotating nozzle head.

FIG. 1, FIG. 2, and FIG. 3 show different views of the core details of the wet treatment apparatus 1 according to one embodiment of the present invention.

The apparatus comprises a spin chuck 3 for holding and rotating a wafer W and non-rotating nozzle head 20. The spin chuck has a base body 10, which is mounted onto a rotating support plate 41.

The support plate 41 is connected to a rotating hollow shaft 42 (rotor), which is part of a hollow shaft motor 40. The hollow shaft motor has an outer stator 40 and an inner rotor. The stator 40 is connected to a machine frame part 43, 44 with a frame plate 43 and a connecting part 44. The cylinder-like non-rotating nozzle head 20 is connected stationary to the connecting part 44.

The nozzle head 20 therefore leads through the hollow shaft 42 and the support plate 41 leaving a small gap (0.05-0.5 mm) to the inner wall of the hollow shaft 42. This gap between the hollow shaft 42 and the nozzle head 20 is sealed by an annular duct 47, which is connected to a suction device (not shown) through suction line 46.

The base body 10 of the spin chuck, which is mounted onto the rotating support plate 41, has an inner hole leaving a small gap (0.05-0.5 mm) to the nozzle head 20.

A cover plate 12 is mounted onto the base body 10, whereby an inwardly open gas distribution chamber 34 is generated. The cover plate 12 has a central plate 11, which is mounted to the cover plate. The central plate 11 is shaped in order to correspond to the shape of the nozzle head, wherein the central plate does not touch the nozzle head leaving a small gap G2 between the nozzle head 20 and the central plate 11 with a distance in a range of 0.05 and 0.5 mm. The inner hole of the central plate 11 corresponds to the nozzle 26 leaving a gap G3 with a distance d in a range of 0.05 and 0.5 mm.

At the bottom of the gas distribution chamber 34 a plate 13 is mounted to the base plate 10 leaving a chamber between the base plate 10 and the plate 13 for the tooth gear 16. The tooth gear 16 is rotatable connected to the base plate 10 by the bearing 17. The chamber for the tooth gear 16 thus does not have a connection to the gas distribution chamber 34.

The spin chuck 3 comprises six cylindrically shaped holding elements 14 with eccentrically mounted gripping pins 13. The gripping pins 13 are rotated about the holding elements' cylinder axis by a tooth gear 16. The tooth gear 16 is rotated against the base-body 10 of the spin chuck by holding the tooth gear by a vertically movable rod 18 (penetrating through a not shown slit in the base-body) while slightly rotating the base-body with the hollow-shaft motor 40. Thereby the cylindrical holding elements 14 are rotated and the gripping pins 13 turn into open position. The tooth gear 16 drives the tooth gears 15, which are part of the holding elements 14. After a wafer has been placed onto the gas cushion provided through gas nozzles 36 within the gripping pins 13, the base body is turned back and the tooth gear turns into close position driven by springs (not shown). Thereby the gripping pins 13 contact the wafer's edge and securely grip the wafer.

The nozzle head 20 comprises three lines (fluid line 24, gas line 28, and vacuum line 46), which are substantially parallel to the rotational axis of the spin chuck. The fluid line 24 leads to the fluid nozzle 26 for treating the wafer surface, which faces the spin chuck.

The gas line 28 is part of the non-rotating part of the gas supply line for providing gas for the gas cushion. In the upper part of the nozzle head the gas line 28 splits into four branches 29. The branches 29 of the gas line end in an annular non-rotating gas distribution chamber 30. The non-rotating gas distribution chamber 30 opens into the rotating gas distribution chamber 34 through twelve openings 32.

An annularly arranged plurality of gas nozzles 36 is coaxially arranged with respect to the rotational axis. Each gas nozzle is slanted outwardly by and angle α of about 30° of the rotational axis.

More than 80% of gas, which has been supplied from the non-rotating gas distribution chamber 30 into the rotating gas distribution chamber 34, is dispensed through the openings 36 for providing the gas cushion in the gap 38 between the wafer and the cover plate 12.

The rest of the gas, which has been introduced into the rotating gas distribution chamber 34, is used for purging the gaps G1, G2, and G3 between the non-rotating nozzle head 20 and the spin chuck 3.

G1 is the gap between the nozzle head 20 and the base body 10 of the spin chuck. Gas, which has been introduced into gap G1 is removed through the annular duct 47, which is connected to the suction line 46.

G2 is the gap between the upper part of the nozzle head 20 and the lower side of the central plate 11 and G3 is the gap between the nozzle 26 and the central hole of the central plate 11.

For collecting spun off liquid a collecting chamber (annual duct—not shown) is concentrically arranged around the spin chuck. For spinning liquid into different vertically arranged annular ducts the stationary frame and the collecting chamber can be axially shifted against each other (as disclosed for instance in U.S. Pat. No. 4,903,717).

In the following a process for liquid treatment of a semiconductor wafer is described.

A wafer is placed onto the gas cushion of the spin chuck provided by gas, which is introduced through gas nozzles 36. The wafer freely floats on the gas cushion. Thereafter the gripping pins 13 are closed and hold the wafer by contacting the wafer's edge.

Then the chuck is rotated and treatment liquid (e.g. an etchant) is dispensed onto the top surface of the wafer through liquid dispense nozzle 50. The liquid radially flows towards the wafer's edge and is spun off the wafer. The liquid partly wraps around the wafer's edge and wets the peripheral region of the wafer's lower surface.

Rinsing liquid is thereafter dispensed onto wafer's top surface thereby displacing the treatment liquid from the top surface and the peripheral region of the lower surface of the wafer. However residues of the treatment liquid may remain on the lower surface.

In order to remove these residues during rinsing the top surface, the lower surface is also rinsed through the non-rotating nozzle 26. If the same rinsing liquids are used from above and from below these liquids are collected together and can be recycled for immediate reuse. While rinsing liquid is dispensed through nozzle 26 the gas flow for the gas cushion is reduced to a remaining minimum so that liquid may not flow into the nozzles 36 or into the gap G3. However, the gas flow shall be selected small enough so that the rinsing liquid, which radially flows across the lower surface of the wafer, is not disturbed. In other words—the rinsing liquid shall fully cover the lower surface of the wafer during the rinsing step.

After the rinsing step a drying step is performed wherein drying gas (e.g. nitrogen or a nitrogen/2-propanol mixture) is supplied from below through nozzle 26 and from above through nozzle 50.

The invention claimed is:

1. An apparatus for wet treatment of a single plate-like article comprising:
   a spin chuck for holding and rotating a plate-like article about an axis of rotation, said spin chuck comprising holding elements for holding a plate-like article at an edge thereof when mounted on said spin chuck;
   a gas supply for providing a gas cushion between the plate-like article and the spin chuck and for directing gas towards the side of the plate-like article facing the spin chuck, said gas supply comprising (i) a gas nozzle rotating with the spin chuck, (ii) a rotating gas distribution chamber, which is part of the spin chuck, and which supplies gas to said gas nozzle, and (iii) a non-rotating gas feed supplying gas to said rotating gas distribution chamber, said non-rotating gas feed comprising at least one gas outlet positioned within said rotating gas distribution chamber; and
   a fluid supply positioned so as to direct fluid onto a side of a plate-like article that faces the spin chuck, through a non-rotatable fluid nozzle.

2. The apparatus according to claim 1, wherein the aas supply comprises a plurality of gas nozzles.

3. The apparatus according to claim 2, wherein the plurality of gas nozzles are annularly arranged with respect to the rotational axis.

4. The apparatus according to claim 1, wherein the gas supply comprises an annular gas nozzle.

5. The apparatus according to claim 1, wherein the non-rotatable fluid nozzle and the non-rotatable gas feed are elements of a nozzle assembly, which axially leads through the centre of the spin chuck.

6. The apparatus according to claim 1, wherein the spin chuck comprises a plate parallel to the plate-like article, the plate having a central hole, through which the non-rotatable fluid nozzle leads through.

7. The apparatus according to claim 1, wherein the spin chuck comprises movable gripping elements for gripping the plate-like article at its edge.

8. The apparatus according to claim 1, with at least two non-rotatable fluid nozzles.

9. The apparatus according to claim 1, wherein a non-rotatable fluid nozzle is connected to a liquid source.

10. An apparatus for wet treatment of a single plate-like article comprising:
    a rotatable spin chuck to rotate the plate-like article with a holder to hold the plate-like article at the plate-like article's edge;
    a gas supply system within the rotatable spin chuck including a gas nozzle and a gas distribution chamber that rotate with the spin chuck,
    wherein the rotatable gas distribution chamber is inwardly open to receive gas from an opening in a non-rotatinc gas distribution chamber, and
    wherein the gas supply system directs the received gas towards the side of the plate-like article facing the spin chuck to provide a gas cushion between the plate-like article and the spin chuck; and
    a fluid supply system including a. fluid nozzle to direct fluid onto the side of the plate-like article facing the spin chuck.

11. The apparatus according to claim 10, wherein the gas supply system comprises a plurality of gas nozzles.

12. The apparatus according to claim 11, wherein the plurality of gas nozzles are annularly arranged with respect so a rotational axis of the spin chuck.

13. The apparatus according to claim 10, wherein the gas nozzle is an annular gas nozzle.

14. The apparatus according to claim 10, further comprising a non-rotating gas feed including the non-rotating gas distribution chamber and a plurality of annularly arranged gas nozzles or a slit-shaped annular gas nozzle to feed gas into the gas distribution chamber within the rotatable spin chuck.

15. The apparatus according to claim 14, further comprising a nozzle assembly including the non-rotating gas feed, axially leading through the center of the spin chuck.

16. The apparatus according to claim 10, wherein the spin chuck includes a plate, parallel to the plate-like article, with a central hole for the non-rotatable fluid nozzle.

17. The apparatus according to claim 10, wherein the fluid system includes at least two non-rotatable fluid nozzles.

\* \* \* \* \*